United States Patent
Dessard et al.

(10) Patent No.: US 6,714,079 B2
(45) Date of Patent: Mar. 30, 2004

(54) DIFFERENTIAL AMPLIFIER WITH GAIN SUBSTANTIALLY INDEPENDENT OF TEMPERATURE

(75) Inventors: Vincent Dessard, Louvain-la-Neuve (BE); Denis Flandre, Brussels (BE)

(73) Assignee: Universite Catholique de Louvain, Louvain-la-Neuve (BE)

(*) Notice: Subject to any disclaimer, the term of this patent is extended or adjusted under 35 U.S.C. 154(b) by 0 days.

(21) Appl. No.: 10/182,642
(22) PCT Filed: Feb. 12, 2001
(86) PCT No.: PCT/BE01/00020
§ 371 (c)(1), (2), (4) Date: Sep. 23, 2002
(87) PCT Pub. No.: WO01/59926
PCT Pub. Date: Aug. 16, 2001

(65) Prior Publication Data
US 2003/0038678 A1 Feb. 27, 2003

(30) Foreign Application Priority Data
Feb. 11, 2000 (GB) .............................................. 0003067
May 19, 2000 (EP) ............................................ 00110707

(51) Int. Cl.[7] .............................................. H03F 3/45
(52) U.S. Cl. ...................... 330/256; 330/253; 330/261
(58) Field of Search ................................. 330/256, 257, 330/258, 259, 261, 253

(56) References Cited

U.S. PATENT DOCUMENTS

| | | | |
|---|---|---|---|
| 3,991,380 A | 11/1976 | Pryor | |
| 5,748,040 A | * 5/1998 | Leung | 330/253 |
| 5,783,970 A | 7/1998 | Pleitz | |
| 5,847,600 A | 12/1998 | Brooks | |
| 6,127,891 A | * 10/2000 | Eschauzier et al. | 330/255 |
| 6,377,120 B1 | * 4/2002 | Hsieh | 330/253 |

FOREIGN PATENT DOCUMENTS

| | | |
|---|---|---|
| DE | 43 20 006 A1 | 12/1994 |
| WO | WO 93/05572 A1 | 9/1992 |

* cited by examiner

Primary Examiner—Henry Choe
(74) Attorney, Agent, or Firm—Barnes & Thornburg

(57) ABSTRACT

A differential amplifier is described comprising an input branch for receiving differential and common mode input signal components; an output branch providing differential and common mode output signal components; and the differential amplifier being adapted to set a relationship between the magnitude of the common mode output signal component level of the amplifier with respect to the magnitude of the common mode input signal component level to the input stage so that the common mode output signal component level intrinsically follows the common mode input signal component level as a common mode follower without using feedback control of the common mode output signal component. Also an asymmetrical amplifier is described which may be advantageously used as a component of the differential amplifier.

24 Claims, 5 Drawing Sheets

DIFFERENTIAL AMPLIFIER WITH GAIN SUBSTANTIALLY INDEPENDENT OF TEMPERATURE

The present invention relates to a differential amplifier, particularly to an instrumentation preamplifier or sensor differential amplifier. Such amplifiers preferably have constant gain over a wide temperature range. The present invention also relates to an asymmetrical differential amplifier with differing gains on its two inputs.

TECHNICAL BACKGROUND

In analog circuitry, signals are often represented by differential signals, e.g. voltages or currents. A differential signal may be described by a common mode component and a differential component. The common mode component may be looked upon as the average of two signals whereas the differential component is the difference between the same signals. Preferably, a differential amplifier has a high immunity to common mode changes or noise (high common mode rejection) and is therefore often preferred compared to a single end amplifier. Different applications place different requirements on a differential amplifier, for instance very precise gain is preferred for instrumentation applications whereas for sensors constant gain over a wide temperature range is more important than accurate gain at one temperature. The temperature range at constant gain preferably extends up to temperatures used for sensor equipment in which thermal noise has to be eliminated.

FIG. 1 illustrates a known fully differential amplifier using two single ended amplifiers and a resistor network of three resistors. The latter determine the gain of the complete device. The input and output common mode signals are at the same level while the differential input signal is amplified depending on the ratio of $R_1$ and $R_2$. The precision of the gain is determined by the precision of the resistors and by the finite gains of both amplifiers. By matching resistor characteristics and keeping the gain of the amplifiers as high as possible, the gain may be made independent of temperature over a large range. WO97/36371 describes an improvement of this known device in which switching is used to eliminate resistor mismatch.

There are several problems with this known device. First of all the gain is limited by the resistor ratio obtainable. Secondly, integration onto a single chip requires a lot of chip area for the resistors and amplifiers with Miller capacitors and current-consuming output stages to drive the resistors. In the case of a preamplifier for sensor applications, two stages are normally used. The first stage is the sensor itself with its bias circuit followed by a second stage fully differential amplifier, each stage of this chain contributing to the noise.

A single ended OTA (Operational Transductance Amplifier) is known from the article by Wang et al., Analog Integrated Circuits and Signal Processing, 8, pages 21–35 (1995), Kluwer Academic Publishers, Boston (USA), entitled "Partial positive feedback for gain enhancement of low power CMOS OTA's". The OTA includes an internal active load for gain and bandwidth enhancement. It comprises an input transistor pair whose sources are connected to a bias current source. Differential input currents are mirrored by an active mirror which presents a different mirror ratio for common mode and differential inputs. The desired gain depends on the transistor size ratio. One of the active load currents is mirrored by a further current mirror. The output current is formed by the difference between this last mirrored current and the other output of the active current mirror. An optimised sizing of the active current mirror allows a gain and bandwidth increase without increasing the power consumption. The whole amplifier can be considered like a single stage amplifier with only one dominant pole and therefore no frequency compensation capacitor is required.

EP-A-554743 describes a fully differential amplifier with common-mode stability enhancement. In order to get a higher pole in common mode versus differential mode, an active load is used whose scheme is similar to the active load of the Wang amplifier. The active load acts like a current source with a very high differential input impedance. The amplifier can therefore be considered as a two stage differential amplifier which may imply the use of a Miller capacitor for stability. Inversely, for common mode signals the active load acts as a low impedance. In this case, the amplifier acts as a single stage amplifier, which has no stability problem. Common mode regulation circuitry is provided which consists of a single ended amplifier and two resistors. It is necessary to set the common mode output DC voltage. If this is not done, the common mode output voltage may be too low, pushing the input transistors into the linear region. If the voltage is too high pushing the output transistors into the linear region. Accordingly, it is necessary to provide a feedback circuit to regulate the DC output voltage. The junction of the resistors of the feedback circuit is known as the common mode summation point and gives a measure of the DC common mode output voltage. the feedback control should operate in such a manner that all transistors are kept in the saturation region.

U.S. Pat. No. 3,991,380 describes a complementary field effect transistor differential amplifier which feeds back output voltages from output nodes 12, 22 to common summation nodes "A" and "B". Transistors P-3, P-4, N-3, NA are coupled together in pairs to form resistor networks the centre points of which provide the summation points.

The book "Design of Analog Integrated Circuits and Systems" by K. R. Laker and W. M. C. Sansen, McGraw-Hill International editions, 1994, provides many useful comments on and examples of the design of OTA's and of common mode regulation feedback circuits.

An object of the invention is to provide a differential amplifier which allows integration onto chip in a compact and efficient manner.

Another object of the invention is to provide a differential amplifier with a constant gain over a wide temperature range.

A further object is to provide a differential amplifier with a simpler circuit design.

Still a further object opf the present invention is to provide a differential amplifier which is stable independent of the load capacitance.

Yet another object of the present invention is to provide a differential amplifier which may be constructed using various technologies.

Still another object is to provide an asymetrical amplifier.

SUMMARY OF THE INVENTION

The present invention provides a differential amplifier comprising: an input branch for receiving differential and common mode input signal components; an output branch providing differential and common mode output signal components; and the differential amplifier being adapted to set a relationship between the magnitude of the common mode output signal component level of the amplifier with respect to the magnitude of the common mode input signal comonent level to the input branch so that the common mode output signal component level intrinsically follows the common mode input signal component level as a common mode follower without using feedback of the common mode output signal component. The input and output branches are connected in parallel. The amplifier does not use feedback control of the common mode output signal component to or from a common summation point. The common mode output signal component voltage $V_{com}$ of the amplifier is at least approximately represented by:

$$V_{com} = \alpha V_{in} + k$$

where $V_{in}$ is the common mode input signal comonent voltage and $\alpha$ is within the range 0.5 to 1.5, more preferably in the range 0.7 to 1.3. The amplifier is powered by voltage source of voltage $V_s$ and k may be ±50% of $V_s$ or of less absolute magnitude. The value of k may be within 300 mV of a set value of k. The differential gain precision at room temperature may be 20% or less, preferably 5% or less, most preferably 1% or less. The differential gain drift between −20° C. and 250° C. is preferably 30% or less, more preferably 20% or less, most preferably, 5% or less. The differential gain may be set to between 1 and 50 at room temperature by the design of the amplifier.

The differential amplifier may further comprise an active load circuit, the active load circuit linking the input branch to the output branch and having a larger differential gain than common mode gain. The active load circuit may comprise two current mirror circuits linking the input branch to the output branch, wherein the current mirror circuits each have a differential gain different from its common mode gain. The active load circuits are designed to provide the same current densities in the transistors of the input and output branches. This improves the temperature response of the amplifier. The amplifier is preferably implemented using active devices of the same type and manufacture, e.g. transistors and that by matching these transistors the differential gain is constant to within 1 dB, more preferably to within 0.5 dB, and most preferably to within 0.2 dB over a temperature over a range of at least 100° C., more preferably at least 150° C. nd most preferably over 200° C.

The amplifier described above is preferably used as a preamplifier. The amplifier may be constructed in a variety of technologies, e.g. MOS field effect transistors, bipolar transistors, SOI. One particular advantage is that it does not require passive components so that it may be integrated easily and compactly onto a single chip.

The present invention also includes an asymmetrical differential amplifier with at least one output and at least two inputs, preferably for use with the differential amplifier mentioned above, wherein the gains on each of the two inputs are different One of the inputs is preferably split into two inputs, the second input being for application of a differential signal opposite in sign to the signal applied on the one input.

The present invention will now be described with reference to the following drawings. Further embodiments of the present invention are detailed individually in the dependent claims.

DESCRIPTION OF THE ILLUSTRATIVE EMBODIMENTS

The present invention will be described with reference to certain embodiments and with reference to certain drawings, but the present invention is not limited thereto but only by the claims. It is preferred in accordance with the present invention if the amplifiers described are used as preamplifiers with a small differential signal swing on the input. In the following description it is assumed that all transistors are biased to saturation.

Figure 1:
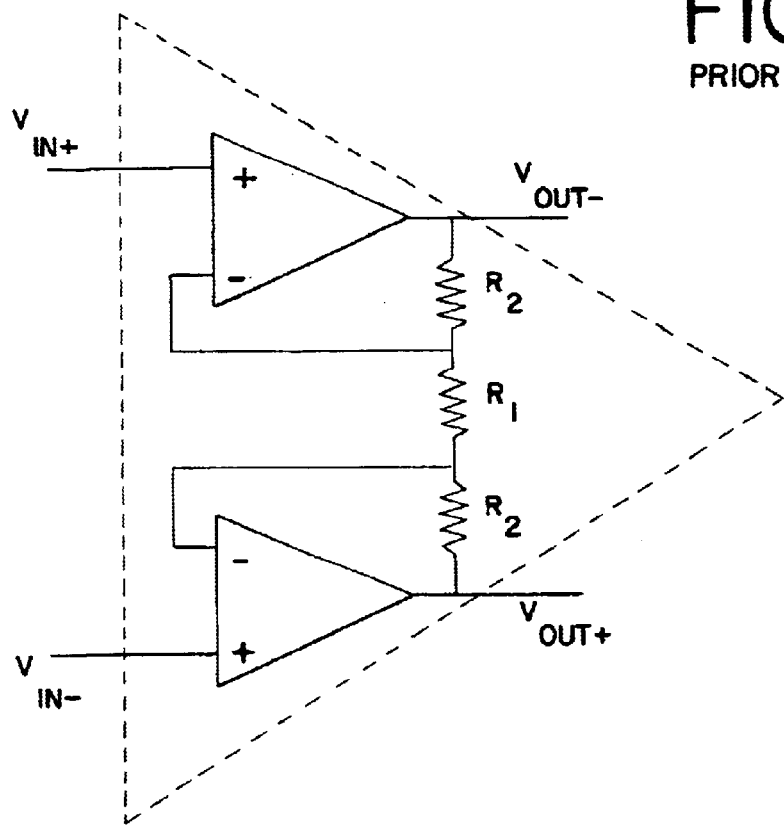
FIG. 1 is a circuit diagram of a conventional fully differential amplifier.
Figure 2:
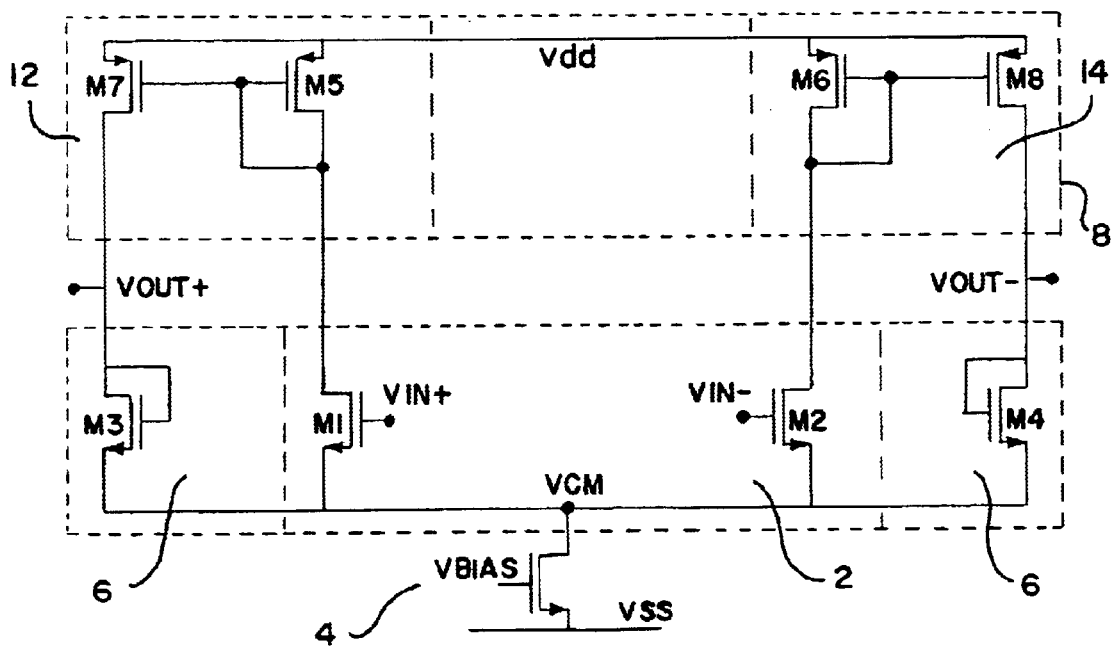
FIG. 2 is a schematic representation of a first embodiment of a differential amplifier in accordance with the present invention.

A first embodiment of the present invention is shown schematically in FIG. 2. It is a fully differential amplifier and comprises an input branch 2 comprising a differential and common mode input of, for instance, a matched pair of transistors M1 and M2 of a first conductivity type, e.g. NMOS, with one of their main current electrodes connected together, e.g. their sources. The output branch 6 comprises a second differential and common mode device comprising two matched transistors M3 and M4 having the first conductivity type, e.g. NMOS, and being diode connected, for example, the gate and drain electrodes connected together. The one main current electrodes of transistors M3 and M4 are connected to the one main current electrodes of the input pair M1 and M2 so that these all lie on the same potential. This one common electrode, e.g. source, is connected to a voltage or current source 4 depending on the application and the required performance. The one common electrode for M1 to M4 avoids the need of a separate common mode regulation circuit, i.e. avoids the use of feedback control from the output branch in order to regulate and control the transistors of the output and/or input branch in the saturated region.

The four other main electrodes of the transistors, e.g. drains, of these two differential pairs M1, M2; M3, M4 are connected to an active load circuit 8. This active load circuit 8 has two inputs and two outputs which are respectively connected to the other main electrodes, e.g. drains, of the input and output differential pairs M1, M2; M3, M4, respectively. Due to its symmetry the active load circuit 8 can be split into two blocks 12, 14 each having one input and one output. Each half active load circuit may be considered as a current mirror circuit. Each current mirror comprises two transistors M5, M7; M6, M8 of the opposite conductivity type, e.g. PMOS, whereby the control electrode (gate) of the active load input transistors M5; M6 is connected to the other main electrode (drain) of that transistor. The control electrode (gate) and the one main electrode (source) of each input transistor M5; M6 are connected to the control electrode (gate) and the one main electrode (source), respectively of the output transistor M7, M8 of the same half active load circuit to form a conventional current mirror circuit. The sources of transistors M5, M6, M7, M8 are all connected to one power source electrode Vdd and the bias circuit 4 is connected to the other power source electrode $V_{ss}$.

The circuit of FIG. 2 avoids the use of a common mode regulation circuit while still keeping the output and input transistor pairs M4, M3; M1, M2 in the saturation region by the use of a single common electrode between the transistors M1 to M4. This common electrode has a strong influence on the common mode operation of the circuit, the currents flowing in the transistors M1 to M4 being constrained by the common connection to the voltage or current source 4 as well as by the current mirror circuit 8. The amplifier circuit does not use passive components such as resistors but rather uses an all transistor design using diode connected output transistors instead of passive resistors. This makes the circuit easier and more compact to fabricate as an integrated circuit and also reduces the temperature dependence of the gain.

Although the circuit of FIG. 2 represents a significant improvement, the temperature dependence is not perfect as the transistors M1, M3 and M2, M4 have to work at different current densities to provide gain. For instance, they do not necessarily all have the same drift of characteristics over temperature. A second embodiment of the present invention which is a significant improvement over the first embodiment is shown schematically in FIG. 3. It also comprises an input branch 2 comprising a differential and common mode input of, for instance, a matched pair of transistors M1 and M2 of a first conductivity type, e.g. NMOS, with one of their main current electrodes connected together, e.g. their sources. The output branch 6 comprises a second differential and common mode device comprising two matched transistors M3 and M4 having the first conductivity type, e.g. NMOS, and being diode connected, for example, the gate and drain electrodes connected together. The one main current electrodes of transistors M3 and M4 are connected to the one main current electrodes of the input pair M1 and M2 so that these all lie on the same potential. This one common electrode, e.g. source, is connected to a voltage or current source 4 depending on the application and the required performance. The one common electrode for M1 to M4 again avoids the need of a separate common mode regulation circuit, i.e. avoids the use of feedback control from the output branch in order to regulate and control the transistors of the output and/or input branch in the saturated region.

The four other main electrodes of transistors, e.g. drains, of these two differential pairs M1, M2; M3, M4 are connected to an active load circuit 8. This active load circuit 8 has two inputs and two outputs which are respectively connected to the other main electrodes, e.g. drains, of the input and output differential pairs M1, M2; M3, M4 respectively. Due to its symmetry, the active load circuit can be split into two blocks 12, 14, each containing one input and one output. The input part of each half active load 12; 14 consists of two transistors in parallel M5, M9; M6, M10, the transistors M5 and M9; M6 and M10 preferably being of different size. Each half active load circuit may be considered as a current mirror circuit. By parallel connection is meant that the same main electrodes (e.g. sources or drains) of the transistors are connected together. Each current mirror comprises three transistors M5, M7, M9; M6, M8, M10 of the opposite conductivity type, e.g. PMOS, whereby the control electrode (gate) of the first one of the current mirror input transistors M5; M6 is connected to the other main electrode (drain) of that transistor. The control electrode (gate) and the one main electrode (source) of the first input transistor M5; M6 are connected to the one main electrode (source) and the control electrode (gate) of the output transistor M7, M8 of the same half active load circuit to form a conventional current mirror circuit. The control electrode (gate) of the second input transistor M9, M10 is connected to the control electrode of the first input transistor M6, M5 of the other half active load circuit.

The two additional transistors M9 and M10 provide positive feedback. As long as transistors M9, M10 are smaller than the parallel transistors M5, M6, the effect of the positive feedback being to reduce the apparent transductance seen by both input transistors M1, M2 at their drains for differential signals. The behaviour of each half active load circuit 12, 14 behaves differently depending on the applied signal common mode and differential mode parts. In accordance with an embodiment of the present invention the input and output transistors M5, M9 and M7; M6, M10 and M8, respectively are sized such that a) the current density in the output and input transistors M3, M4 and M1, M2 is the same;
b) the differential gain of the active load circuit 8 is K,
c) the common mode gain of the active circuit is close to 1, e.g. in the range 0.5 to 1.5, more preferably in the range 0.7 to 1.3.

If dimensions of the transistors M1 to M4 are the same, the ratio of the drain current of the output transistors M7, M8 of the current mirror to the drain current of the input transistors M5, M6 of the current mirror to the drain current of the input transistors M9, M10 of the current mirror may be represented by 2K:K+1:K−1 in one embodiment. K then represents approximately the differential gain of the amplifier. The value 2K is equal to the sum of the drain current ratios of the input transistors M5, M9; M6, M10, each of which has a size represented by K+1 (M5, M6) and K−1 (M9, M10) respectively. In this specific case the current mirrors act with unity gain for the common mode component of the input signal (2K/[(K+1)+(K−1)]) and as a current amplifier with a gain of about K for the differential component of the input signal (2K/[(K+1)−(K−1)]). Thus the current from circuit 4 is split equally among the four connections from the common electrode joining the sources of transistors M1 to 4 with the current mirror transistors. By making the size, manufacture and type of the differential output diode connected transistors M3, M4 the same as the differential input transistors M1, M2 then these four transistors are subject to the same current, hence have the same current density. For transistors of the same type and manufacture, the stability of the transductance ratio gm is governed by the current density which is constant in this embodiment so that a significantly better stability of the gain over temperature is obtained compared with the embodiment shown in FIG. 2. The total differential gain is given by the transductance ratio of the input and output transistors (M1, M2; M3, M4) which is unity in this case multiplied by the active load gain of K. The accuracy of this value and the stability with temperature depends on the ratio $(2K_1/[(K_2+1)-(K_3-1)])$ where there are slight differences between the three K values. This gain error will increase with K value due to the low precision obtained with the difference of two imprecise and large numbers. The typical gain value range will be 20 dB compatible with the fact that the amplifier will only handle small voltage swings. The total common mode gain is given by the transductance ratio of the input and output transistors (M1, M2; M3, M4) which is unity in this case multiplied by the common mode gain of the active loads which is 1 in this case. Thus for common mode signals the amplifier acts as a common mode follower, the common mode output voltage following the common mode input voltage (although the term common mode follower should not be interpreted in such a way that the ratio of the common mode output signal to the input signal is exactly unitary, In fact a suitable range is 0.5 to 1.5, more preferably in the range 0.7 to 1.3.). The amplifier may be described as having intrinsic common mode regulation compared to common mode regulation based on feedback of a signal from the output of the amplifier. By intrinsic is meant that a separate feedback circuit is not provided but rather that the design of the amplifier is such that common mode regulation is an inherent property of the amplifier design and is achieved with circuit components within the amplifier.

By altering the ratios of the three transistors M5, M7, M9; M6, M8, M10, the amplifier may be given arbitrary common mode and differential mode gains, each gain being individually settable compared to the other. For example, if the ratio of the size of the transistor M1, M2 to the size of transistor M3, M4 is z, then the above ratios must be modified to 2K/z:K+1:K−1. In addition, there is no constraint on the unit transistor size because there is no feedback. As the low-frequency noise level decreases with increasing unit transistor size, it is a specific aspect of the amplifier in accordance with the present invention that the noise level can be made as low as required by increasing transistor sizes without impairing other performance.

Figure 3:
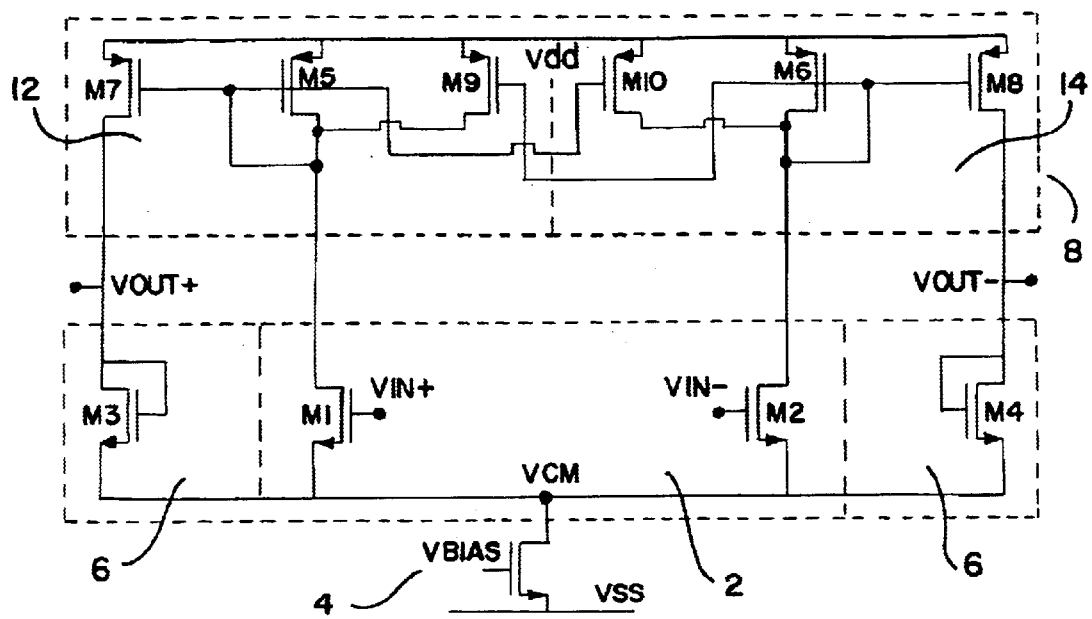
FIG. 3 is a schematic representation of a second embodiment of a differential amplifier in accordance with the present invention.
Figure 4:
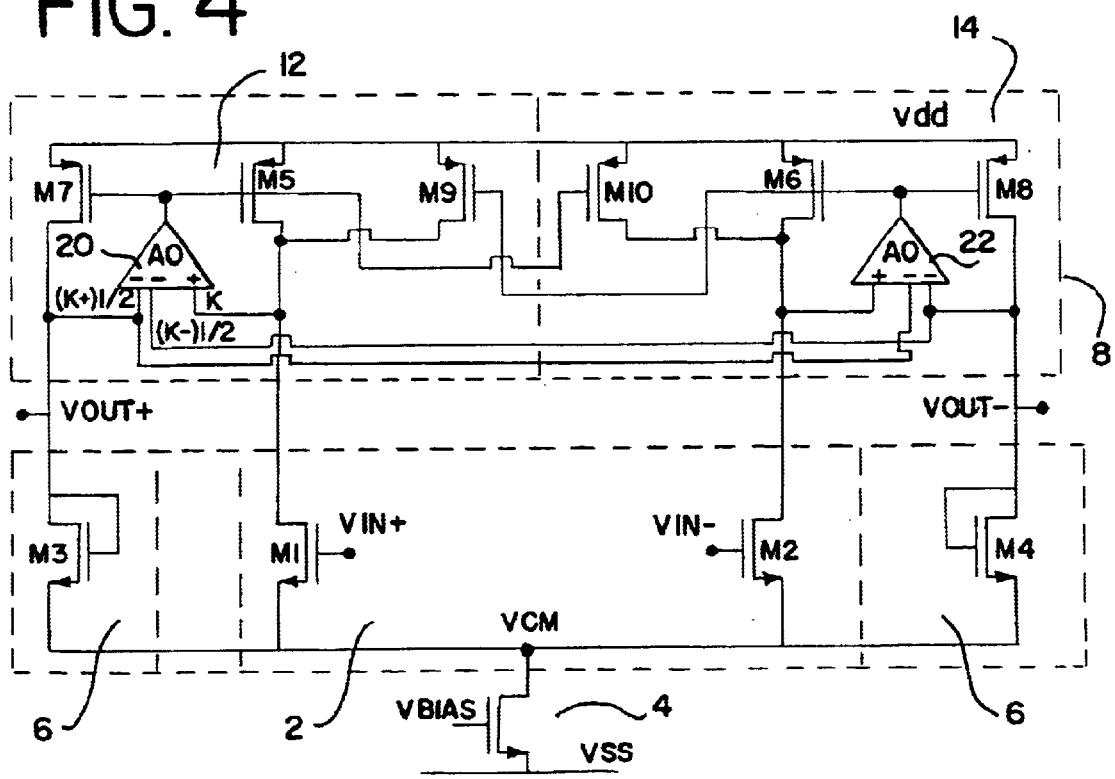
FIG. 4 is a schematic representation of a third embodiment of a differential amplifier in accordance with the present invention.
Figure 5:
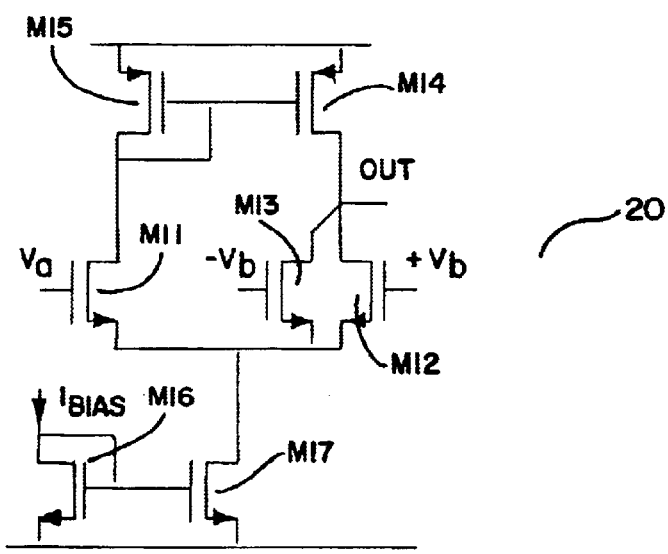
FIG. 5 is a schematic representation of a fourth embodiment of an asymmetrical amplifier in accordance with the present invention.

Although the amplifier of FIG. 3 is a considerable improvement, the effect of the output conductance (gd) of the transistors has been ignored. The Early voltage effect leads to a parasitic impedance in parallel with the circuit transductance. Early voltage can lead to a temperature dependence of gain. In accordance with a third embodiment of the present invention an asymmetrical single ended operational transductance (OTA) amplifier 20, 22 is used to regulate the half current mirrors 12, 14 as shown in FIG. 4. This provides a very weak temperature dependence of the gain as well as a precise gain. To achieve this the amplifiers 20, 22 must have a different gain for their positive and negative inputs, hence the name "asymmetrical". An equivalent circuit of an asymmetrical amplifier 20 in accordance with an embodiment of the present invention is shown in FIG. 5. The asymmetrical amplifier has an input device which comprises two signal inputs. This input device will be called an "equivalent input" of the asymmetrical amplifier in the following. The equivalent negative input of each asymmetrical amplifier 20 is connected to the half active load output while the positive input of each asymmetrical amplifier 20 is connected to the corresponding half active load input. The output of each asymmetrical amplifier drives the control electrode (gate) of the input transistor M5, M6 of the corresponding half active load.

As shown in FIG. 5, an asymmetrical amplifier 20 in accordance with this embodiment includes a differential pair M11, M12 whose common source is connected to a bias current source M16, M17. Drains of the differential pair are connected to a current mirror M14, M15. The output of the amplifier corresponds to the output of the current mirror M14, M15. An additional transistor M13 is placed in parallel with one of either of the differential pair input transistors M11, M12 depending upon the gain wanted for each equivalent input $V_a$, $V_b$ of the asymmetric amplifier. Further, depending upon the respective gain wanted for both inputs, the gate of the additional transistor M13 is connected to the symmetric one $-V_b$ of the signal inputs of the other asymmetric amplifier in the other current mirror half thus providing an inverted small signal. The gain of each asymmetrical amplifier may be described as:

$$v_{out}=A.[v_a-\xi v_b]$$

or $$i_{out}=gm[v_a-\xi v_b] \text{ (OTA version)}$$

where $\xi$ is less than 1 and greater than 0. The voltages $v_a$ and $v_b$ are referred to a common mode voltage. In the asymmetrical amplifier the output is determined by positive and negative inputs $v_a,v_b$ each having a different weighting.

The effect of the additional transistor is controlled by the feedback from the other asymmetrical amplifier to its gate. For differential signals the feedback of the negative input signal from the second asymmetrical amplifier can be used to control the ratio of the gain of the positive input to the negative input of the first asymmetrical amplifier and vice versa. If $\xi$ is set to 1/K, the gain of the positive input is K times that of the corresponding equivalent negative input and the influence of parasitic impedances caused by the Early effect is reduced approximately by the corresponding equivalent negative input gain of the asymmetrical amplifier.

Figure 6:
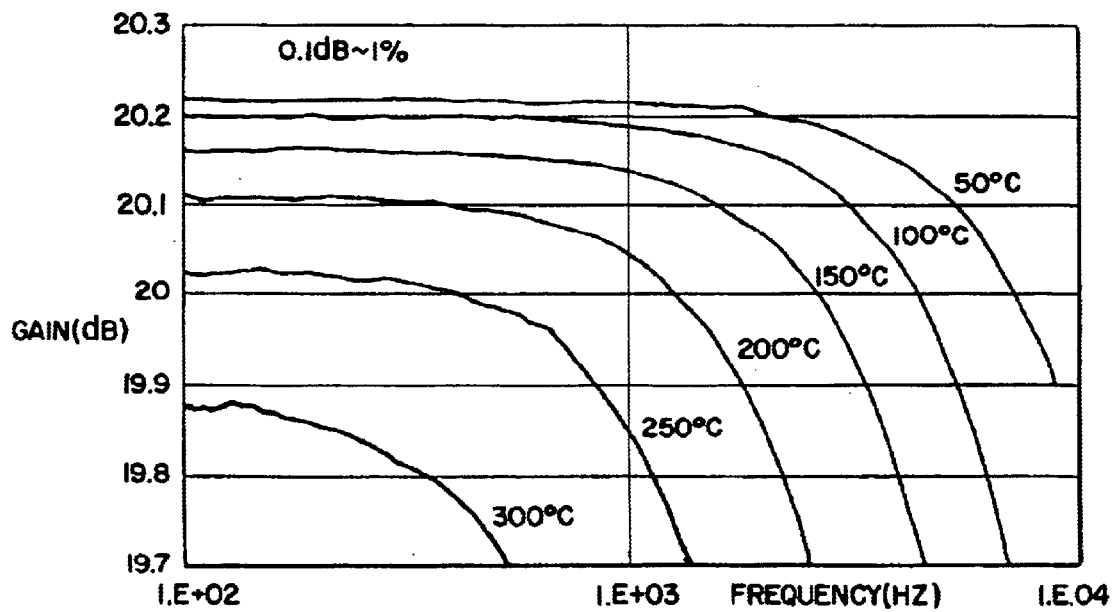
FIG. 6 is graph showing the temperature response of a differential amplifier shown in FIG. 4.

The temperature response of the low frequency gain of the amplifier shown in FIG. 4 is shown in FIG. 6 for a value of K of 10 and a differential input voltage of 1 mV and bias currents of 5 microamp and 1 milliamp in the asymmetric and main amplifiers respectively. It can be seen that the gain is constant to within 1 dB, more preferably within 0.5 dB and most preferably within 0.2 dB over a range exceeding 100° C., more preferably exceeding 150° C. and most preferably exceeding 200° C.

Figure 7:
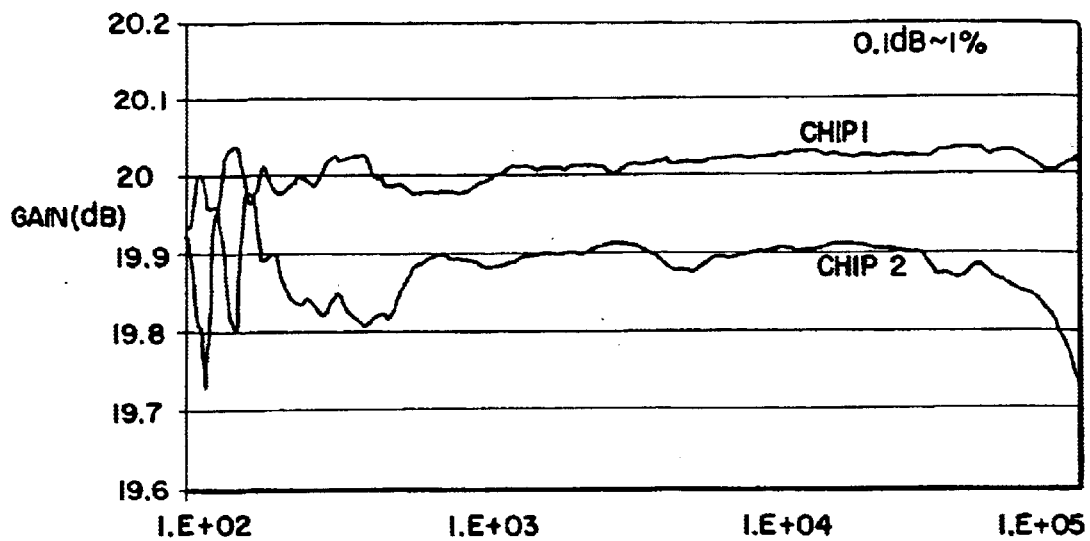
FIG. 7 is graph showing the frequency response of two differential amplifiers shown in FIG. 4 implemented in accordance with an industrial process, e.g. with good matching.

The frequency response of the gain of two amplifiers implemented on chips in accordance with FIG. 4 is shown in FIG. 7 for a differential input voltage of 1 mV and K=10. The gain is constant to within ±0.03 dB up to 100 kHz.

Figure 8:
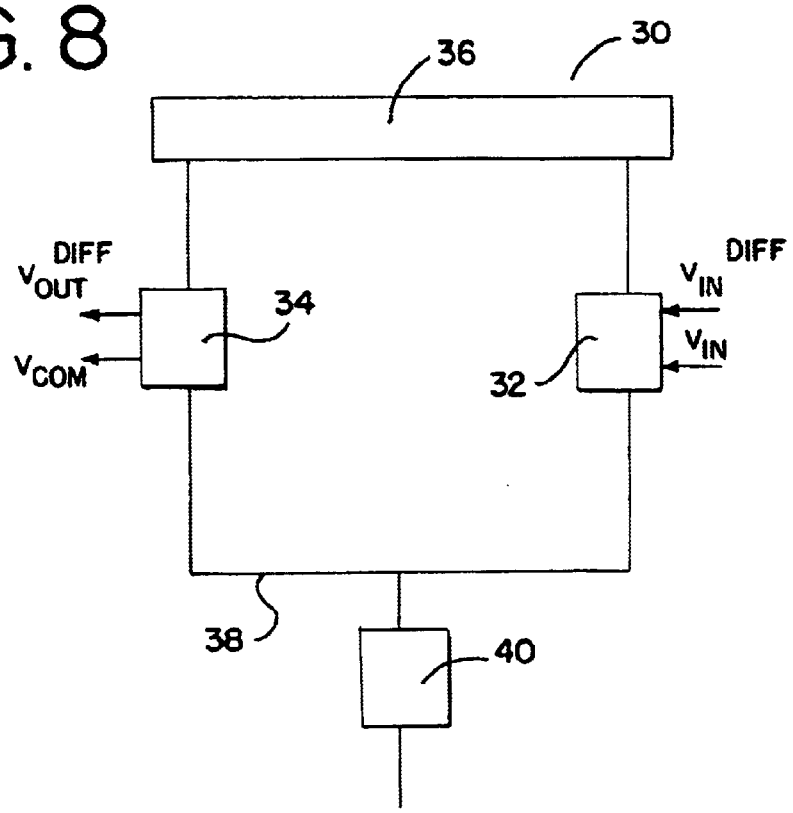
FIG. 8 is a schematic representation of an amplifier in accordance with an embodiment of the present invention.

From the above certain aspects of the present invention may be understood which are summarised schematically in FIG. 8. The embodiments of the present invention all provide a differential amplifier 30 with an input transistor branch 32 and an output transistor branch 34. These two branches are connected in parallel at one side by a connection 38 and on the other side by an active load circuit 36. A bias circuit 40 is provided which is connected to the connection 38. The input branch has a differential input signal component represented schematically as a differential voltage $V_{in}^{diff}$ and a common mode input signal component represented schemtically by a common mode input voltage $V_{in}$. The output branch has a differential output signal component which may be represented by a differential voltage $V_{out}^{diff}$ and a common mode output signal component represented by a common mode voltage $V_{com}$.

The amplifier is designed so that the current densities in the transistors of the transistor branches are substantially the same at any time independent of how the common mode input voltage $V_{in}$ varies. Placing the bias circuit 40 outside the parallely coupled input and output branches assists in this. This provides a very good temperature dependence of the amplifier characteristics. The amplifier is preferably implemented using active devices of the same type and manufacture, e.g. matched transistors. By matching these transistors the differential gain is constant to within 1 dB, more preferably to within 0.5 dB, and most preferably to within 0.2 dB over a temperature over a range of at least 100° C., more preferably at least 150° C. nd most preferably over 200° C. The active load circuit 36 is provided by current mirrors which have a differential gain which is higher than the common mode gain. The common mode output voltage $V_{com}$ is at least approximately represented by:

$$V_{com} = \alpha V_{in} + k$$

where $V_{in}$ is the common mode input voltage. The value of α can be designed to within the range 0.5 to 1.5, more preferably in the range 0.7 to 1.3 by selection of the physical components of the amplifier. When the amplifier is powered by voltage source of voltage $V_s$, the value of k may be set to a value ±50% of $V_s$ or of less absolute magnitude. Due to the design olf the amplifier a value of k may be achieved in practice, e.g. in a series manufacture, within 300 mV of a set value of k. The differential gain precision at room temperature in such a series manufacture may be 20% or less, preferably 5% or less, most preferably 1% or less. Practical values of the differential gain drift between −20° C. and 250° C. are 30% or less, more preferably 20% or less, most preferably, 5% or less. The differential gain may be set to between 1 and 50 at room temperature. This is particularly suitable for a preamplifier, in particular an instrumentation preamplifier. The differential gain of the amplifier is independent of the current flowing through the bias circuit. The differential gain may be further adjusted or set by a feedback circuit external to the amplifier (not shown) as is well known to the skilled person. Alternatively, the differential gain may be set intrisically to the amplifier by matching the impedance of the output branch to the transductance of the input branch to thereby set the differential gain of the amplifier to a constant value. This provides amplifier stability independent of the capacitance of the amplifier load.

Figure 9:
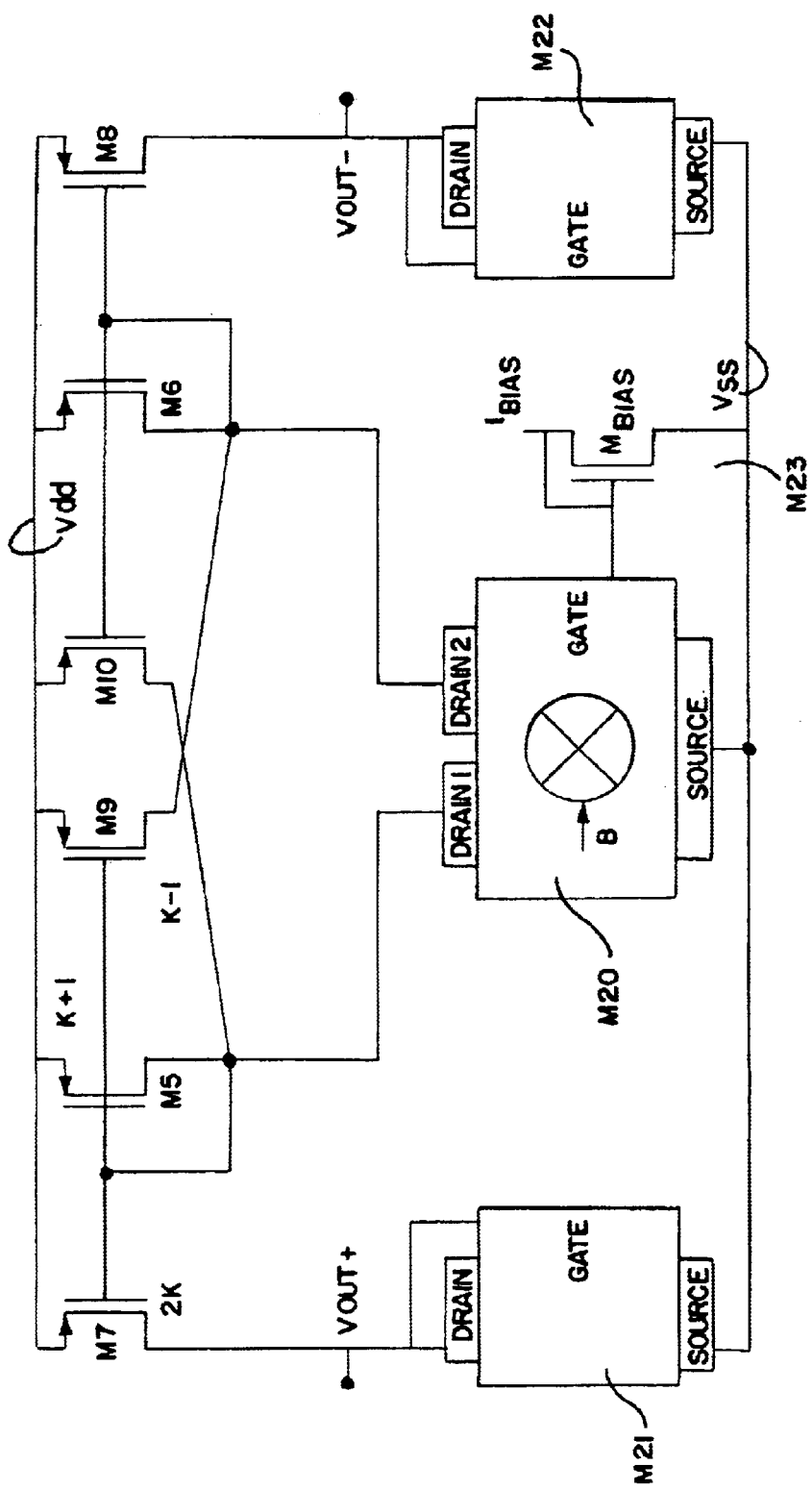
FIG. 9 is a schematic representation of a magnetic sensor with a low temperature dependence in accordance with a further embodiment of the present invention.

While the invention has been shown and described with reference to preferred embodiments, it will be understood by those skilled in the art that various changes or modifications in form and detail may be made without departing from the scope and spirit of this invention. For instance, for special cases where the common mode input signal is well known and stable, the biasing circuit 4 can be removed. The current in all four amplifier branches is then imposed by the common mode input voltage. For certain sensor application, a magnetic differential pair based on a split drain structure can replace the differential transistor input pair described above. For instance, an amplifier in accordance with another embodiment of the present invention is shown schematically in FIG. 9. The circuit of FIG. 9 is similar to the circuit of FIG. 3 except that the biasing circuit 4 is not used, the input to the differential amplifier is not a matched pair of transistors but a magnetic sensor M20 with a pair of split drain outputs, a gate of the magnetic sensor M20 is connected to a biasing circuit M23 and a source electrode of the magnetic sensor M20 is connected to the common line between the sources of a matched pair of diode connected output magnetic sensors M21, M22. With this circuit the common gate voltage of the split drain sensor M20 is fixed at a constant voltage by applying a bias current from the biasing circuit M23 or by applying a voltage directly to the gate and dispensing with M23. The input to the differential amplifier is a magnetic field B and not a differential voltage. The use of similar magnetic sensors M21, M22 as the output branch for the amplifier instead of two diode connected output transistors results in the circuit being a Hall sensor with a sensitivity increased by the differential gain K. Using a sensor as the input rather than using a sensor followed by a conventional amplifier gets rid of the sensor biasing circuitry and of the differential input transistors leading to improved noise performance. Temperature dependence is decreased due to the use of a similar magnetic sensors in the output circuit.

The present invention includes provision of a set of amplifiers with each amplifier having different transistor sizse, the amplifiers with increased transistor sizes having reduced the low-frequency noise level.

What is claimed is:

1. A differential amplifier comprising:
   a differential input branch for receiving an input signal with differential and common mode input signal components, the input branch providing a first output signal with common mode and differential mode components generated with respect to a voltage plane;
   a differential output branch receiving the first output signal and providing a second output signal with differential and common mode output signal components, the output branch converting the common mode component of the first output signal to the common mode component of the second output signal with reference to the same voltage plane as the input branch; and an active load circuit linking the input branch to the output branch,
   the differential amplifier being adapted to set a relationship between the magnitude of the common mode component of the second output signal with respect to the magnitude of the common mode component of the input signal to the input branch so that the magnitude of the common mode component of the second output signal intrinsically follows the magnitude of the common mode component of the input signal as a common mode follower without using a common mode feedback regulation circuit for regulating the common mode component of the second output signal.

2. The differential amplifier according to claim 1, wherein the magnitude of the common mode output signal component $V_{com}$ is at least approximately represented by:

$$V_{com} = \alpha V_{in} + k$$

where $V_{in}$ represents the magnitude common mode input signal component and α is within the range 0.5 to 1.5, more preferably in the range 0.7 to 1.3.

3. The differential amplifier according to claim 2, wherein the amplifier is powered by voltage source of voltage $V_s$ and k is ±50% of $V_s$ or of less absolute magnitude.

4. The differential amplifier according to claim 3, wherein the value of k is within 300 mV of a set value of k.

5. The differential amplifier according to claim 1, wherein the differential gain precision at room temperature is 20% or less, preferably 5% or less, most preferably 1% or less.

6. The differential amplifier according to claim 1, wherein the differential gain drift between −20° C. and 250° C. is 30% or less, more preferably 20% or less, most preferably 5% or less.

7. The differential amplifier according to claim 1, wherein the differential gain is between 1 and 50 at room temperature.

8. The differential amplifier according to claim 1, further comprising a bias circuit and wherein the differential gain of the amplifier is independent of the current flowing through the bias circuit.

9. The differential amplifier according to claim 1, wherein the differential gain is set by feedback.

10. The differential amplifier according to claim 1, wherein the differential amplifier is adapted so that the impedance of the output branch is matched to the transductance of the input branch to thereby-set the differential gain of the amplifier to a constant value.

11. The differential amplifier according to claim 1, wherein the active load circuit has a larger differential gain than common mode gain.

12. The differential amplifier according to claim 11, wherein the active load circuit comprises two current mirror circuits linking the input branch to the output branch, wherein the current mirror circuits each have a differential gain different from its common mode gain.

13. The differential amplifier according to claim 1, wherein the input branch comprises a matched transistor pair and the output branch comprises a pair of matched, diode connected output transistors, each transistor comprising a first and a second main electrode and a gate electrode, and the first main electrodes of the matched transistor input pair and the first main electrodes of the pair of diode connected output transistors are connected together.

14. The differential amplifier according to claim 13, wherein the amplifier is adapted so that the effect of output conductance of the transistors in the input and output branch is substantially eliminated.

15. The differential amplifier according to claim 12, wherein each current minor circuit comprises a first and a second input transistor in parallel to each other and an output transistor, the dimensions of these transistors being in a ratio such that:
   a) the current densities in the matched transistor input pair of the input branch and the pair of diode connected output transistors of the output branch are substantially the same;
   b) the differential gain of the current mirror circuit is K.

16. The differential amplifier according to claim 15, wherein the dimensions of the transistors in the input and output branches are the same and the sizes of the transistors in the current mirror circuit are in the following ratios, output transistor of current mirror:first input transistor of current:second input transistor of current mirror =2K:K+1:K−1.

17. The differential amplifier according to claim 15, wherein the dimensions of the transistors in the input and output branches are in the ratio z and the sizes of the transistors in the current mirror circuit are in the following ratios, output transistor of current mirror:first input transistor of current:second input transistor of current mirror =2K/z:K+1:K−1.

18. The differential amplifier according to claim 15, wherein the control electrode of the second transistor of one current mirror circuit is connected to the control electrode of the first input transistor of the other current mirror circuit.

19. The differential amplifier according to claim 1, wherein the amplifier is adapted so that the common mode gain is set independently of the differential mode gain.

20. The differential amplifier according to claim 12, wherein each current mirror circuit further comprises an asymmetrical amplifier connected between the input and the output of the relevant current mirror circuit so that the effect on the gain of output conductance is substantially reduced.

21. The differential amplifier according to claim 1, wherein the input branch comprises a sensor.

22. The differential amplifier according to claim 1, wherein the output branch comprises two sensors.

23. The differential amplifier according to claim 1, wherein the amplifier is a preamplifier.

24. A set of differential amplifiers according to claim 1, the transistor sizes of the amplifiers being different so that the amplifiers with increased transistor sizes have reduced low-frequency noise.

* * * * *